US011231518B2

(12) United States Patent
Mirassou

(10) Patent No.: US 11,231,518 B2
(45) Date of Patent: Jan. 25, 2022

(54) REAL-TIME, FINE ADJUSTMENT OF DRIVER CURRENT OF A LIGHT EMITTING DEVICE OF AN OPTICAL RAIN SENSOR

(71) Applicant: MEAS France, Toulouse (FR)

(72) Inventor: David Mirassou, Toulouse (FR)

(73) Assignee: MEAS FRANCE, Toulouse (FR)

( * ) Notice: Subject to any disclaimer, the term of this patent is extended or adjusted under 35 U.S.C. 154(b) by 161 days.

(21) Appl. No.: 16/838,462

(22) Filed: Apr. 2, 2020

(65) Prior Publication Data

US 2020/0371270 A1    Nov. 26, 2020

(30) Foreign Application Priority Data

May 21, 2019  (EP) ..................... 19305642

(51) Int. Cl.
*B60S 1/08* (2006.01)
*G01V 8/22* (2006.01)
*H05B 45/30* (2020.01)
*H01L 31/173* (2006.01)

(52) U.S. Cl.
CPC .............. *G01V 8/22* (2013.01); *B60S 1/0833* (2013.01); *H01L 31/173* (2013.01); *H05B 45/30* (2020.01)

(58) Field of Classification Search
CPC .. B60S 1/0833; G01N 21/274; G01N 21/552; G01N 2201/0624; G01N 2201/0695; G01V 8/22; H05B 45/30
USPC ............................................. 250/221, 214 R
See application file for complete search history.

(56) References Cited

U.S. PATENT DOCUMENTS

| 5,726,547 A | 3/1998 | Reime |
| 6,634,225 B1 | 10/2003 | Reime |
| 9,615,421 B1 | 4/2017 | Chang et al. |
| 10,605,415 B2 * | 3/2020 | Xiong ..................... F21K 9/278 |

FOREIGN PATENT DOCUMENTS

EP      2996250 A1    3/2016

OTHER PUBLICATIONS

Partial European Search Report, European Application No. 19305642.1-1020, European Filing Date, Nov. 20, 2019.

* cited by examiner

*Primary Examiner* — Que Tan Le

(57) ABSTRACT

An optical rain sensor device includes a first light emitting element adapted to emit a first light pulse toward an inner surface of a transparent substrate, a second light emitting element adapted to emit a second light pulse toward the inner surface of the transparent substrate, a photodetector adapted to detect a light from the first light pulse and the second light pulse that is reflected by the inner surface of the transparent substrate, and a rain sensor controller. The rain sensor controller includes a regulated current source adapted to apply a compensation current signal at a terminal of the second light emitting element based on a regulation signal, so that a total current across the second light emitting element is increased or decreased to reduce an imbalance between the first light pulse and the second light pulse.

18 Claims, 9 Drawing Sheets

REAL-TIME, FINE ADJUSTMENT OF DRIVER CURRENT OF A LIGHT EMITTING DEVICE OF AN OPTICAL RAIN SENSOR

CROSS-REFERENCE TO RELATED APPLICATION

This application claims the benefit of the filing date under 35 U.S.C. § 119(a)-(d) of European Patent Application No. 19305642, filed on May 21, 2019.

FIELD OF THE INVENTION

The present invention relates to a rain sensor and, more particularly, to an optical rain sensor that detects rain and/or moisture drops using light emitting devices and to a fine current adjustment for the driving currents of the light emitting devices.

BACKGROUND

Optical rain sensors are commonly employed as rain-sensitive switches for controlling electric devices in a wide range of applications, such as automotive vehicles and irrigation systems. The detection principle of optical rain sensors is based on detecting the portion of infra-red light emitted by one or more light emitting sources that is reflected from an internal surface of a transparent substrate, such as a windshield. The light reflected from the windshield is detected by a photodetector and the detected signal analyzed to determine variations in the intensity of the reflected light. In case the windshield is covered with rain or moisture drops on its external surface, the total internal reflection of the incident infrared light is reduced and consequently, less reflected light will be detected by the photodetector. The detection of a decrease in the intensity of the detected reflected light is an indication of rain or moisture drops on the external surface of the windshield and may be used for triggering the operation of an electrical device, such as the motor of an automobile wiper.

FIG. 1 illustrates a optical rain sensor device 100 according to the prior art. This sensor design includes an optical sensor 110 with two light emitting elements (LED 120 and LED 125) for detecting rain and/or moisture drops deposited on one side of a transparent substrate 130 (e.g. a windshield). The two LED elements 120, 125 are arranged on the opposed side of the windshield 130 from the rain and/or moisture and oriented such as to make the respective light beams incident on different areas of the windshield 130 with respective incidence angles θ1 and θ2 (with respect to a perpendicular to the substrate 130). The incidence angles θ1 and θ2 may be approximately symmetric (for e.g. −45° and +45°, respectively), as exemplified in FIG. 1.

The emitted light beams are reflected from the windshield onto a photodetector 140, which outputs a detection signal 145 that is processed by an integrated circuit (IC) 150 for detecting the presence of drops. Since moisture and/or rain drops 135 are normally unevenly distributed over wet surfaces, the intensity of the light reflected from LED 120 and LED 125 will differ depending on whether the respective light beams are incident on a region covered by a drop or not. Total internal reflection will be reduced in the presence of a drop on the outward surface, due to the refraction of light through the transparent substrate 130 and the drop, such that the signal from LED 120 will be weaker than that of LED 125. Any sudden variation of difference between the intensity of the detected LED signals is an indication of rain or moisture drops on the substrate 130.

In the optical rain sensor device 100 according to the prior art shown in FIG. 1, if the LED signals are not perfectly balanced, a sensitivity change in the rain sensor photodetector due to exposure to sunlight may lead to false detections. As a result, any sensitivity variations of the photodetector due to sunlight exposure may amplify such imbalance, thus generating a detection signal signature that could be confused with the detection of real moisture drops.

The emission of light from each LED is generally controlled in intensity and frequency by dedicated rain sensor integrated circuit (IC) 150 which outputs driving currents on respective LED channels (for e.g. A and B) suitable for generating light pulses on the LEDs connected to the channels. The amplitude and frequency of the driving currents output by the rain sensor IC 150 can be controlled with a digital-analog converter (DAC) microcontroller 160. The rain sensor LEDs 120, 125 are typically controlled with a driving current of 20 mA amplitude and 100 kHz frequency, which can be coarsely adjusted by existing integrated circuits with a step of about +/−2.5 mA. However, this current resolution is not sufficient for compensating smaller differences between the driving currents of the LED channels (A or B) and as a consequence, it is not possible to correct imbalances between LED signals by adjusting the current on the LED channels of the rain sensor IC 150 to reduce false detections.

SUMMARY

An optical rain sensor device includes a first light emitting element adapted to emit a first light pulse toward an inner surface of a transparent substrate, a second light emitting element adapted to emit a second light pulse toward the inner surface of the transparent substrate, a photodetector adapted to detect a light from the first light pulse and the second light pulse that is reflected by the inner surface of the transparent substrate, and a rain sensor controller. The rain sensor controller includes a regulated current source adapted to apply a compensation current signal at a terminal of the second light emitting element based on a regulation signal, so that a total current across the second light emitting element is increased or decreased to reduce an imbalance between the first light pulse and the second light pulse.

BRIEF DESCRIPTION OF THE DRAWINGS

The invention will now be described by way of example with reference to the accompanying Figures, of which.

DETAILED DESCRIPTION OF THE EMBODIMENT(S)

The present invention will now be more fully described hereinafter with reference to the accompanying drawings, in which exemplary embodiments of the invention are shown. The present invention may, however, be embodied in many different forms and should not be construed as limited to the embodiments set forth herein. Rather, these embodiments are provided so that the disclosure will convey the scope of the invention to those skilled in the art. Like numbers refer to like elements throughout.

The accompanying drawings are incorporated into and form a part of the specification for the purpose of explaining the principles of the invention. The drawings are not to be construed as limiting the invention to only the illustrated and described examples of how the invention can be made and used.

Figure 1:
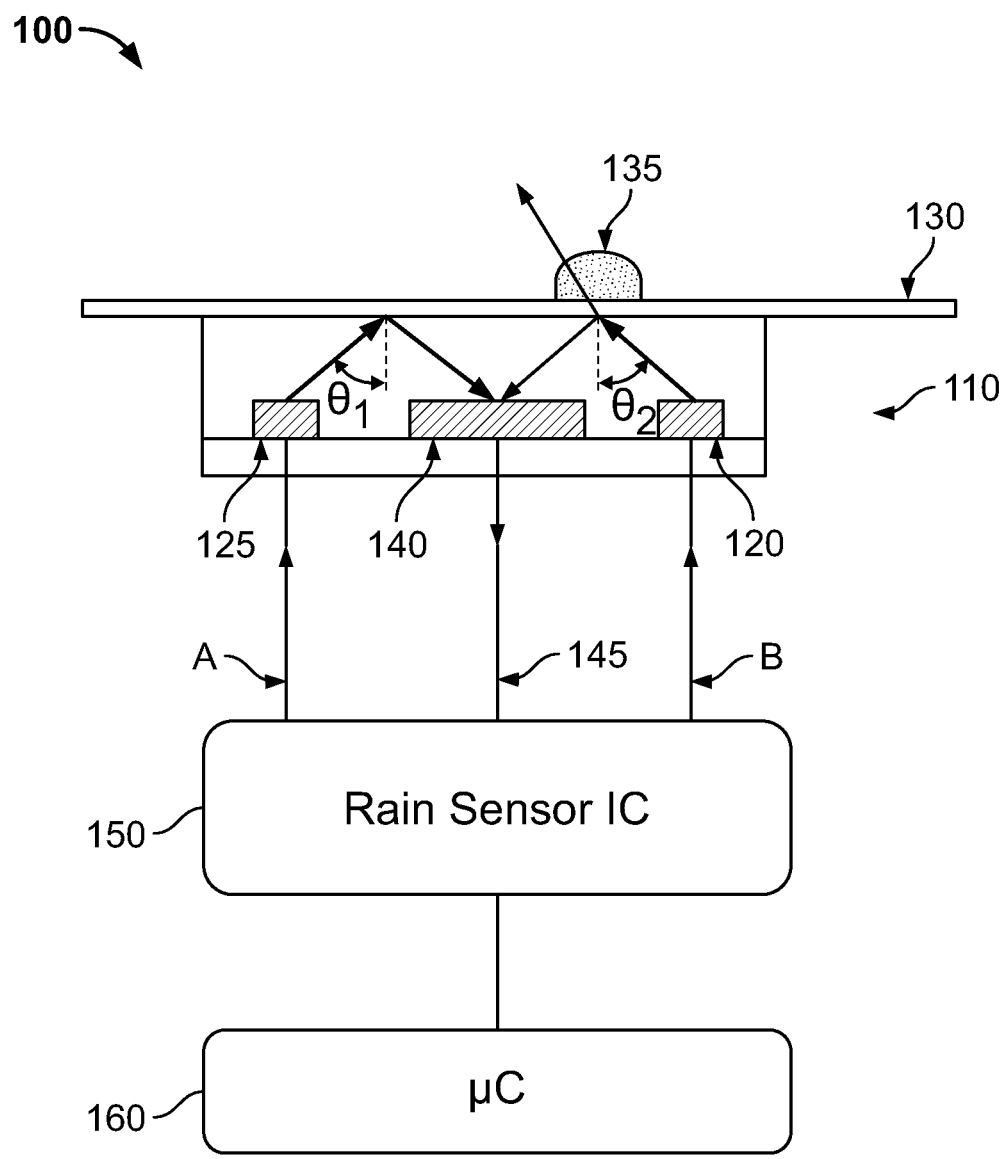
FIG. 1 is a schematic diagram of a conventional optical rain sensor device.
Figure 2:
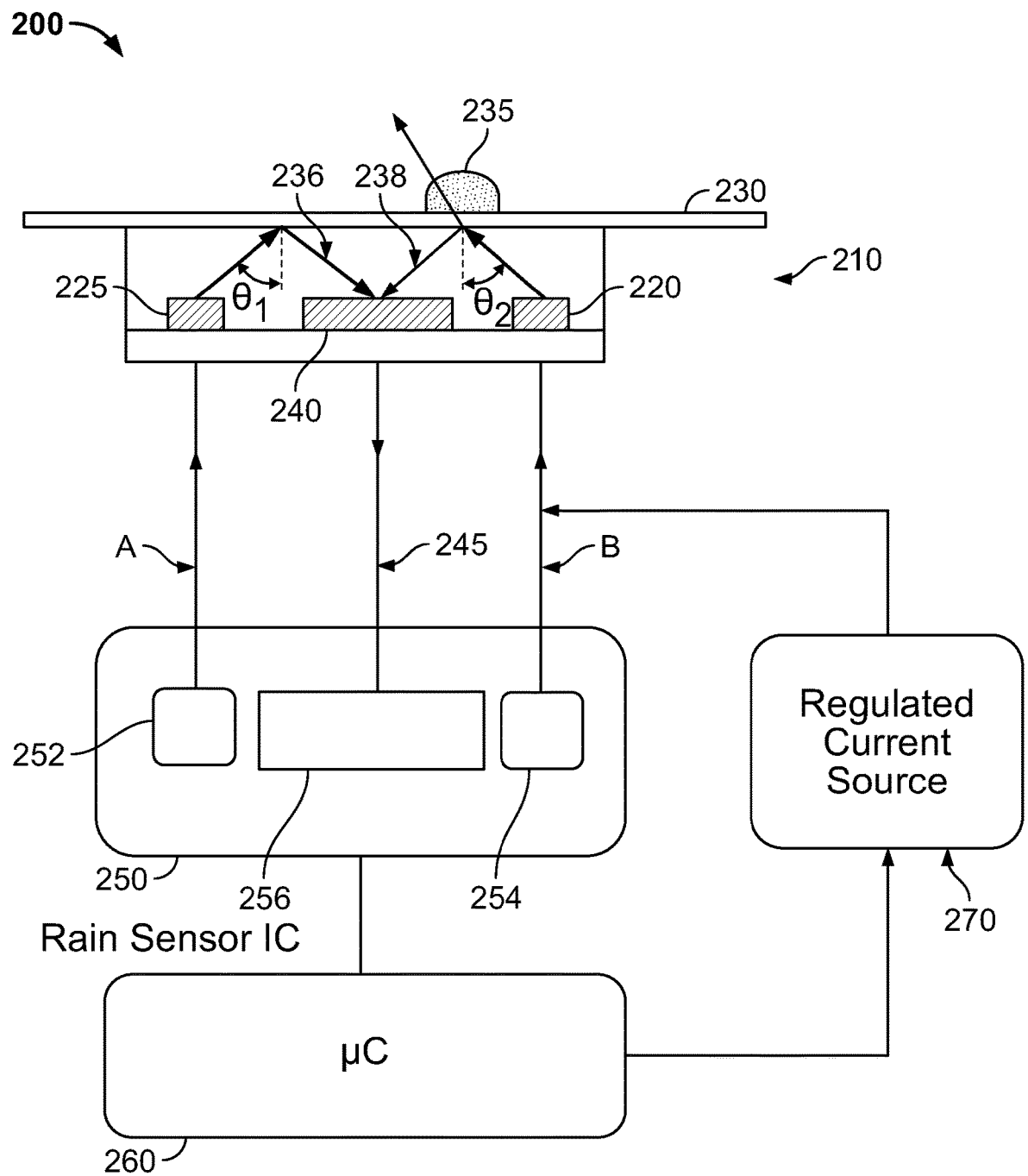
FIG. 2 is a schematic diagram of an optical rain sensor device according to an embodiment of the invention.

FIG. 2 schematically depicts an optical rain sensor device 200 according to an embodiment of the present invention. The rain sensor device 200 includes an optical sensor 210 and at least two light emitting elements 220, 225, such as two infra-red LEDs, which are arranged on a same side of the transparent substrate 230 and oriented so as to make the respective emitted light beams to be incident at different locations of an inner surface of the substrate 230. The respective incidence angles $\theta_1$ and $\theta_2$ for LEDs 220, 225 may be symmetric. However, incidence angles $\theta_1$ and $\theta_2$ may differ between each other, depending on the specific sensor configuration, and have different values from those illustrated in FIG. 2 (and other than) 0°).

A photodetector 240, as shown in FIG. 2, is provided on an intermediate region between the LED elements 220, 225 for detecting the reflected light pulses 236, 238 of each light emitting element 220, 225, and outputting a photodetection signal 245 indicative of the detected intensity of the reflected light pulses 236, 238.

The optical sensor 210 is controlled by a dedicated rain sensor integrated circuit 250 shown in FIG. 2. The rain sensor IC 250 includes two embedded slew rate controlled LED drivers 252, 254 that output driving currents on respective channels A and B for driving the LED elements 225, 220, respectively. A first driver 252 outputs a first driver current pulse (IA) on a first channel (channel A) for driving the light emitting element 225 to emit a light pulse with a given intensity and frequency, and a second driver 254 outputs a second driver current pulse (IB) on a second channel (channel B) for driving the light emitting element 220 to emit a second light signal with respective intensity and frequency. The rain sensor IC 250 also includes a sensitive receiver 256 that receives and processes the detection signal 245 output by the photodetector 240 for detecting the presence of rain and water drops 235 on the windshield 230. The IC 250 may also include additional input channels, such as for inputting ambient light measurements, and an interface for communication (not shown).

The rain sensor IC 250 can control separately the light emitted by each LED element 220, 225 by supplying driving current pulses IA and IB of a desired amplitude and frequency on the respective LED driver channels A and B, respectively. The amplitude, frequency and phase of the driving current pulses IA and IB may be initially selected based on the application for which the rain sensor is intended and/or ambient light conditions and then dynamically adjusted in response to a control signal from a microcontroller 260. Typically, the light emitting elements of conventional rain sensors are driven with current pulses of 20 mA amplitude and 100 kHz frequency. However, an adjustment of the LED driver currents on channels A and B by amounts smaller than the minimum current resolution of the rain sensor IC, which is typically of about 2.50 mA, cannot be achieved. In order to provide a fine adjustment of the LEDs driving currents, the present invention provides an external regulated current source 270 that may be connected to one of the LED channels of the rain sensor IC 250 (for e.g. channel B in FIG. 2) so as to apply a compensation current $I_c$ to the rain sensor LED element 220 connected to the respective LED channel, such as illustrated in FIG. 2.

Figure 3:
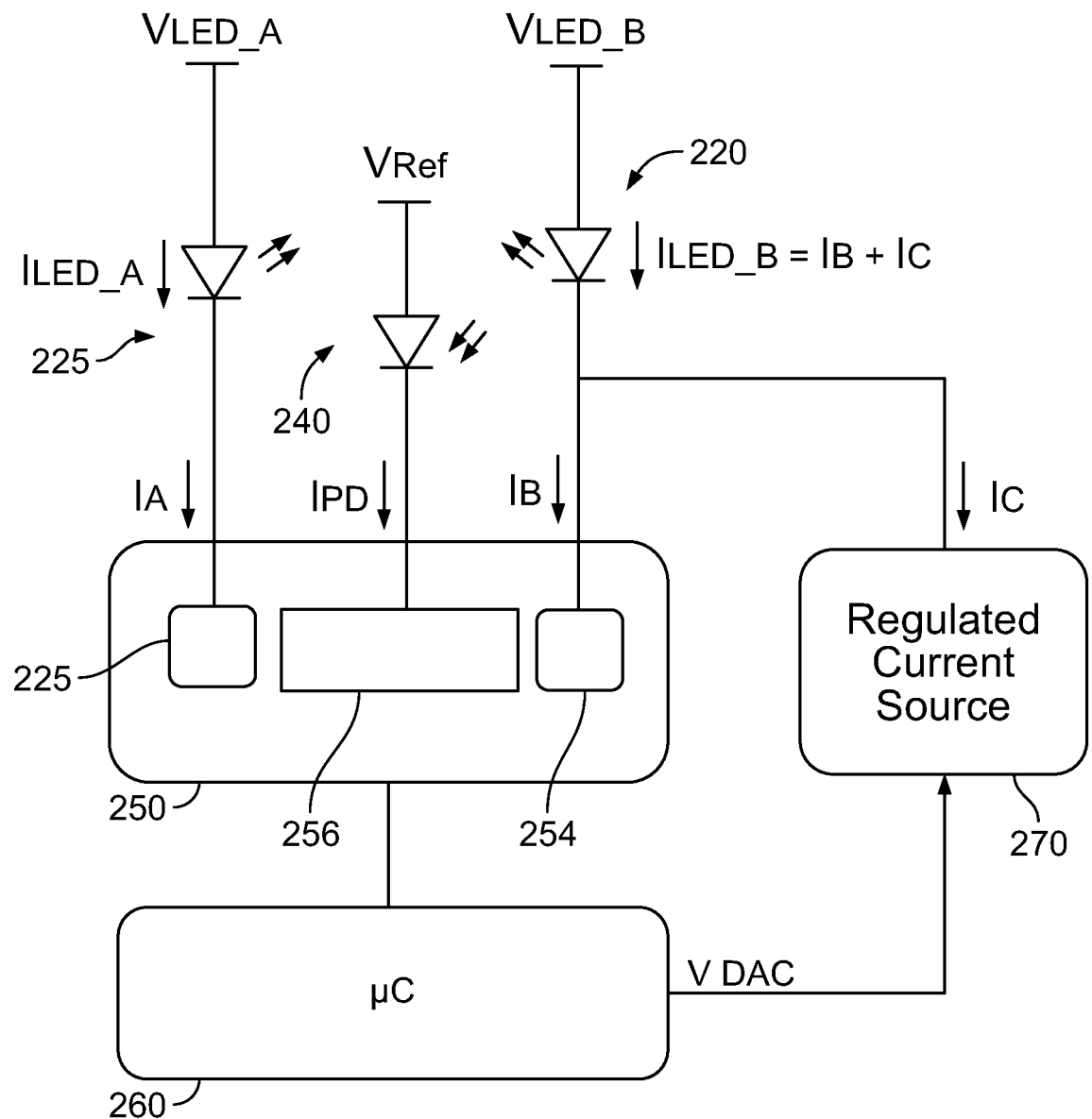
FIG. 3 is a schematic diagram of a connection of a regulated current source to a light emitting element of the optical rain sensor device.

FIG. 3 shows the connection of the external regulated current source 270 to one of the LED channels (channel B) and the compensation of the driving current $I_{LED\_B}$ across the respective light emitting element 220. As shown in FIG. 3, the regulated current source 270 applies the compensation current $I_C$ to the current path between one terminal of the light emitting element 220 (the cathode in the illustrated example) and the output of the respective LED channel of the rain sensor IC 250. This compensation current $I_c$ is superimposed onto the driving current $I_B$ supplied to the light emitting element 220 by the LED driver 254 of the rain sensor IC 250 itself, so that the light emitting element 220 is driven by a total current $I_{LED\_B}=I_B+I_C$, whereas the light emitting element 225 connected to the other LED channel of the rain sensor IC 250 is driven by a driving current $I_{LED\_A}$ corresponding to the current pulse $I_A$ provided by the respective LED driver 252.

The regulated current source 270 may be controlled by a regulation signal $V_{Reg}$, such as an analog voltage $V_{DAC}$ output from a DAC analogue output of the microcontroller 260, to output the compensation current IC with an amplitude that is adjustable based on an imbalance between the measured photodetection signals IPD, as it will be described later. Thus, a fine current adjustment may be easily achieved by suitable software through the microcontroller DAC 260. For instance, a standard 10-bit DAC, which normally provides a current adjustment resolution of 3□A, may be used for this purpose. This allows superimposing a compensation current $I_C$ with a precise value from 0 to 3 mA on the LED channel connected to the regulated current source 270, as it will be explained later. This current regulation is sufficient for achieving a fine current adjustment with steps below the typical minimum resolution of about 2.50 mA provided by LED drivers of conventional rain sensor ICs.

FIG. 3 shows a single light emitting element 220 or 225 on each LED channel A and B of the rain sensor IC 250. In other embodiments, the optical sensor 210 may include one or more LEDs connected in series to the same LED channel, for e.g. so as to cover a larger rain detection area. Furthermore, the optical sensor device 200 may include more than two LED channels and be controlled by a rain sensor IC having a plurality of channel drivers. The photodetector 240 is also not limited to a photodiode as represented in FIG. 3 and other suitable photodetection means that fulfil the same purpose may be used instead.

If the LED signals 236, 238 from the light emitting elements 220, 225 (i.e. the light pulses emitted by LEDs A and B that are reflected by the transparent substrate 230) are well balanced, the photodetector 240 detects a similar light intensity during the high states of the driver pulses $I_A$ and $I_B$ in the absence of rain on the substrate 230, and outputs detection signals 245 with amplitudes that are approximately the same. The photodetection signals 245 are received and processed by the rain sensor IC 250. The microcontroller 260 analyses the measured amplitudes $I_{PD\_LED\_A\_ON}$ and $I_{PD\_LED\_B\_ON}$ of the photodetection signals 245 and any sudden variation in the difference $I_{PD\_LED\_A\_ON} - I_{PD\_LED\_B\_ON}$ will be interpreted by the microcontroller 260 as corresponding to a detection of rain drops. However, as the photodetector sensitivity changes when exposed to sunlight, the driver current pulses $I_A$ and $I_B$ supplied to the light emitting elements 220, 225 must have sufficient amplitude for the respective light pulses being resolved against the ambient light background. At typical driver currents of 20 mA, different LEDs may emit light pulses with slightly different intensities, even if the respective driver currents have the same amplitude, due to differences in their respective characteristics light vs. driving current. This may lead to the microcontroller 260 erroneously identifying a variation between the LED signals measured by the photodetector 240 as being related with detection of a rain drop.

Figure 4A:
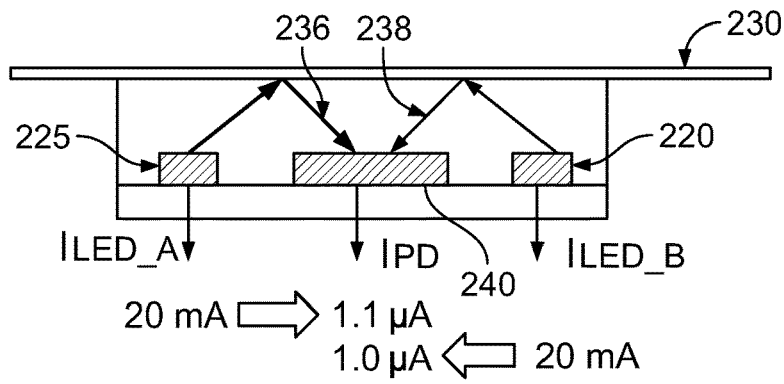
FIG. 4A is a schematic diagram of driving currents across light emitting elements of the optical rain sensor device when driver current pulses have a same amplitude and frequency and the light emitting elements on each channel are imbalanced.
Figure 4A:
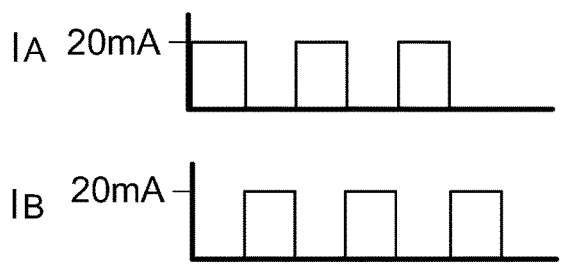

FIG. 4A illustrates an exemplary situation where there are no water drops deposited on the transparent substrate 230 but, despite the LEDs on channels A and B being driven with current pulses $I_A$ and $I_B$ of a same amplitude and frequency, the amplitude of the photodetection signal $I_{PD}$ measured by the photodetector 240 with LED B on, $I_{PD\_LED\_B\_ON}$, is lower than the amplitude $I_{PD\_LED\_A\_ON}$ measured when LED A is on due to an imbalance between the light pulses emitted by LEDs A and B (i.e. an imbalance between the LED signals 236, 238).

The driver signals $I_A$ and $I_B$ supplied by the LED drivers 252, 254 on channels A and B, respectively, as shown in FIG. 4A, are square-wave pulses with an amplitude of 20 mA and a frequency of 100 kHz. However, the driver signals $I_A$ and $I_B$ may have other amplitude, frequency, and/or waveform than those illustrated, depending on the specific application and operating conditions. The pulse signals $I_A$ and $I_B$ are out-of-phase so that the LEDs connected to channels A and B emit light at alternate half-periods. Accordingly, the photodetector 240 outputs a photodetection signal bp of amplitude 1.1 □A when detecting the reflected LED signal 236 from light emitting element 225 and with a lower amplitude of 1.0 □A when detecting the reflected LED signal 238 from light emitting element 220 due to light emitting element 220 emitting a lower light intensity at the same driver current of 20 mA.

Figure 4B:
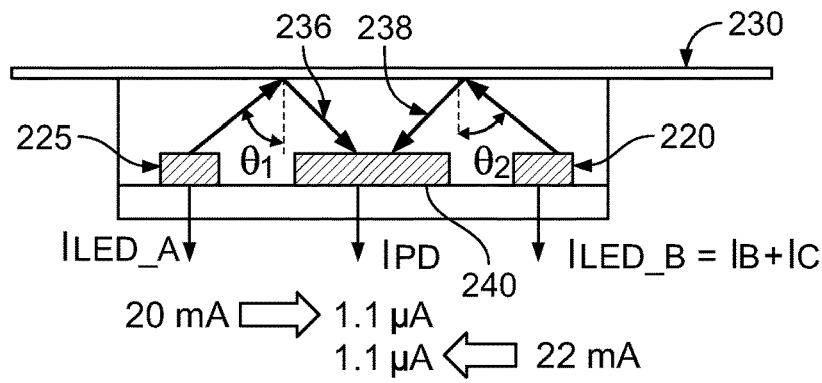
FIG. 4B is a schematic diagram of driving currents when one driver current pulse is in a higher state and a compensation current pulse is applied by a regulated current source for compensating the imbalance in FIG. 4A.
Figure 4B:
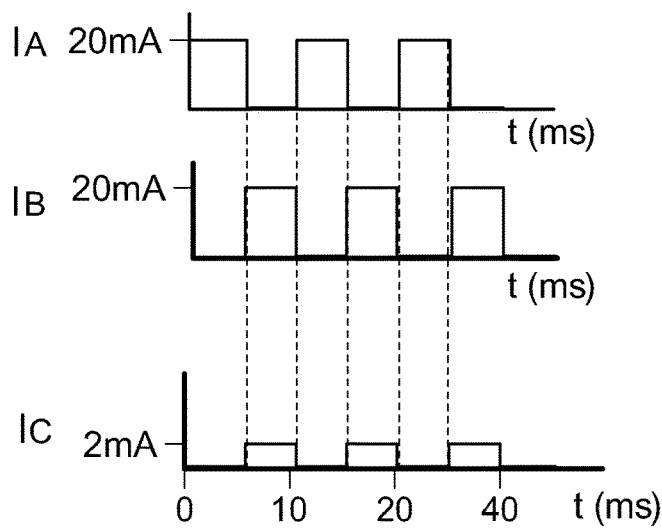

FIG. 4B illustrates the situation where, in order to adjust the imbalance between the detected LED signals 236, 238, a compensation current signal $I_C$ output by the external regulated current source 270 is superimposed onto the driver current pulse on one of the channels (for e.g. channel B). The compensation current signal $I_C$ is a current pulse with the same frequency and synchronized with the driver current pulse on the channel to be compensated, i.e. channel B in the present embodiment. In the situation illustrated in FIG. 4B, the photodetector 240 outputs a detection signal $I_{PD}$ of 1.1 □A amplitude when the light emitting element 225 is driven with 20 mA and a detection signal bp of similar intensity (1.1 □A) when detecting the reflected LED signal 238 from light emitting element 220, which is now driven by a total current of 22 mA, which results from the addition of the driver current $I_B$ of 20 mA with the compensated current of 2 mA applied by the external regulated current source 270.

The synchronization of the compensation current signal $I_C$ with the driver current pulse $I_B$ on the channel to be compensated may be achieved using the reference clock of the rain sensor IC itself. However, not every rain sensor IC commonly used for controlling optical rain sensors provide external access to the internal reference clock.

As it will be explained with reference to FIG. 5, the external regulated current source 270 may synchronize the compensation current signal $I_C$ with the driver current signal on the channel to be compensated by using this driver current signal itself.

Figure 5:
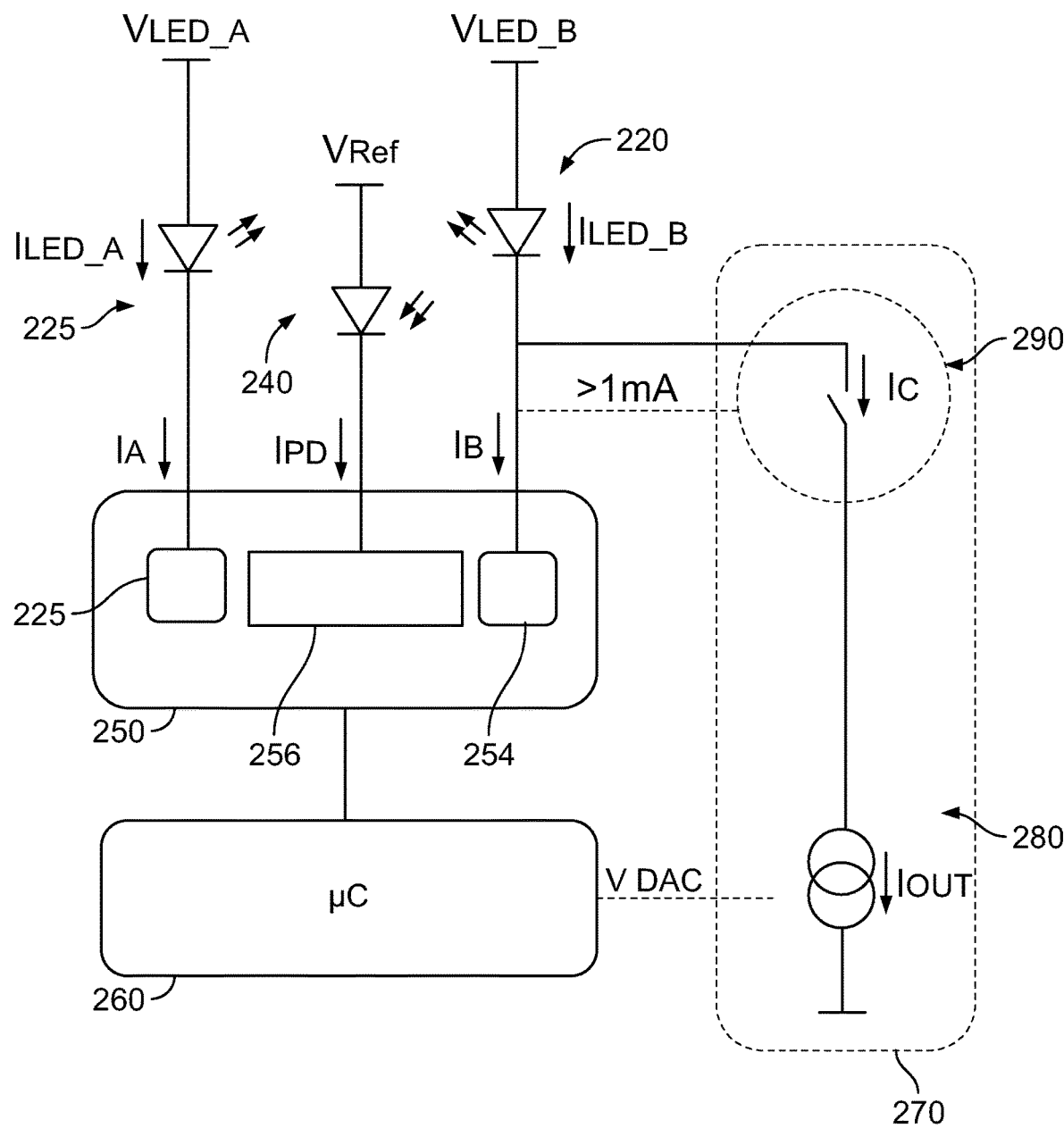
FIG. 5 is a schematic diagram of a regulated current source having a controlled switch and a variable current source according to an embodiment.

FIG. 5 schematically illustrates a regulated current source 270 that provides a compensation current signal $I_C$ which is synchronized with the driver current signal $I_B$ of the rain sensor IC 250 on the channel to be compensated (channel B) using the driver current signal IB. Each of the light emitting elements 225, 220 are connected between respective supply voltages $V_{LED\_A}$, $V_{LED\_B}$ and the outputs of the driver channels A, B of the rain sensor IC 250. The regulated current source 270 applies the compensation current pulse $I_C$ at the path that connects the light emitting device 220 to the driver 254 of channel B so as to increase (or decrease) the total current $I_{LED\_B}$ across the light emitting element 220 when the driver current $I_B$ is on the high state and consequently, reduce an imbalance between the light pulses emitted by the light emitting elements 220, 225. The regulated current source 270 includes a variable current source 280 that provides a DC current $I_{OUT}$ with an intensity that can be varied based on an input regulation signal ($V_{Reg}$), such as the analog voltage signal provided by the analog output ($V_{DAC}$) of the DAC microcontroller 260. For instance, for a $V_{DAC}$ of 2 V, an $I_{OUT}$ our with amplitude of 2 mA may be achieved.

A square pulse signal $I_C$ with amplitude $I_{OUT}$ and synchronized with the driver current $I_B$ applied to the LED channel to be compensated (channel B) is achieved by connecting a controlled switch 290 between the output of the variable current source 280 and the terminal of the light emitting device 220 to be compensated. The controlled switch 290 is connected in series with the variable current source 280 and is operable to switch between on and off states in synchronization with the switching between high and low states of the driver current pulse $I_B$ on the channel B. More specifically, the controlled switch 290 may be operable to open or close based on whether the driver current signal $I_B$ satisfies a given condition, for e.g. when the current signal $I_B$ is above a given current threshold. For typical applications, where driver currents with amplitudes of about 20 mA are used, a current threshold of 1 mA is suitable for detecting when the driver current pulse $I_B$ switches from the low state into the high state and consequently, close the controlled switch 290 for outputting the current $I_{OUT}$ supplied by the variable current source 280 onto the cathode terminal of the light emitting device 220. When the driver current signal $I_B$ on channel B falls below the predetermined current threshold, the controlled switch 290 automatically switches into the off state, disconnecting the variable current source 280 from channel B. Accordingly, the current $I_{OUT}$ is output by the regulated current source 270 when the controlled switch 290 is closed, the total current $I_{LED\_B}$ applied to the light emitting element 220 on channel B then corresponding to a sum of the driver current signal $I_B$ supplied by the driver 254 on channel B and the compensation current $I_C=I_{OUT}$ supplied by the variable current source 280.

Figure 6:
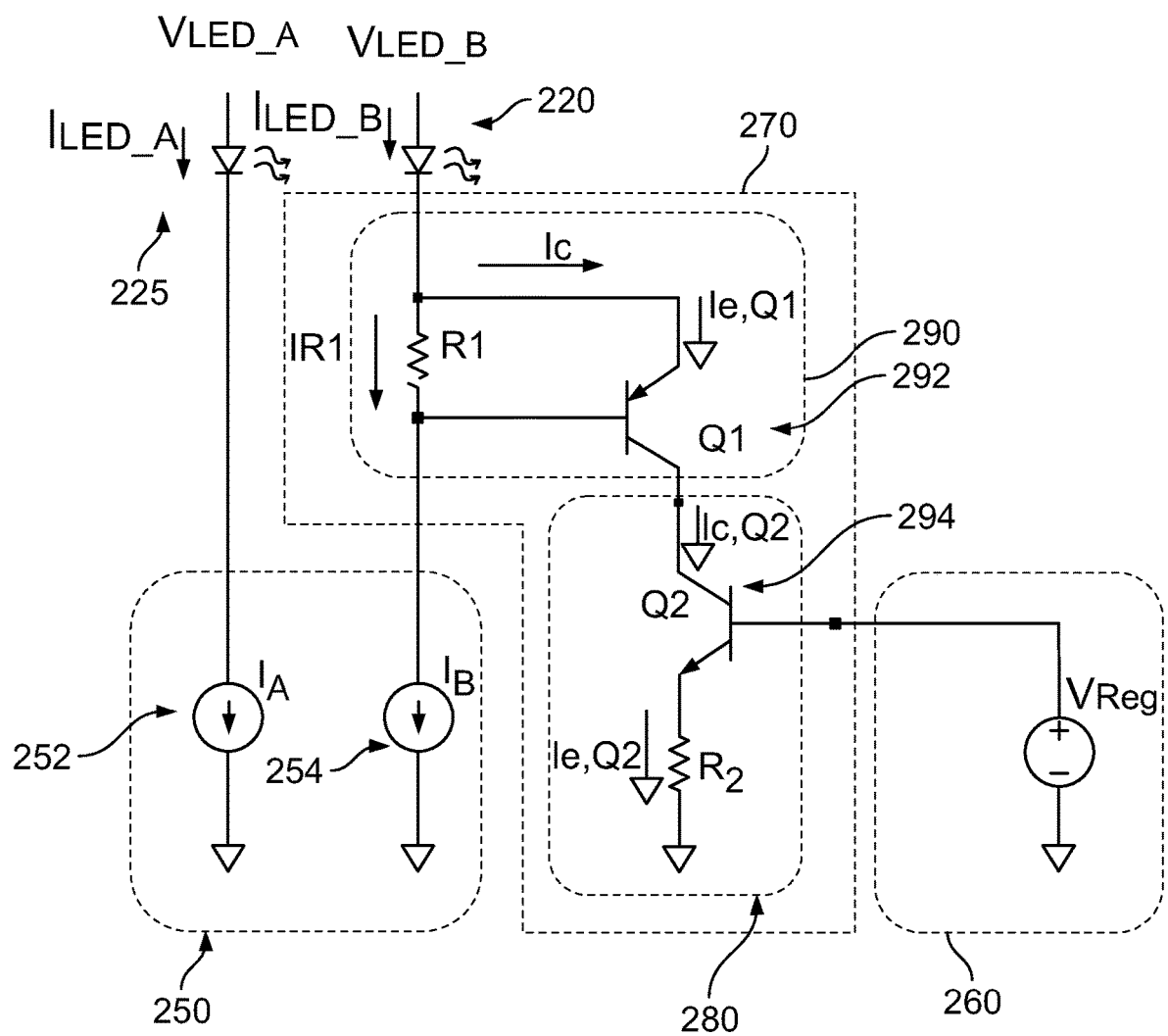
FIG. 6 is circuit diagram of the controlled switch and the variable current source of FIG. 5.

An exemplary implementation of a threshold-current controlled switch 290 is depicted in FIG. 6. For simplicity, the rain sensor LED drivers 252, 254 that apply the currents pulses $I_A$ and $I_B$ on channels A and B are represented as ideal current sources. The controlled switch 290 includes a switch transistor Q1, such as a p-n-p bipolar transistor 292. The p-n-p bipolar transistor Q1 is switched on when the voltage difference across its base and emitter terminals is equal to or higher than a threshold voltage $V_{be,Q1}$, which is a characteristic parameter of the transistor Q1. The current threshold condition for automatically opening or closing the switch transistor Q1 in synchronization with the driver current pulse $I_B$ may be implemented by a resistance R1 connected between the emitter and base terminals of the transistor Q1 and which is inserted between the cathode of the light emitting element 220 and the output of the LED driver 254. Accordingly, the p-n-p transistor Q1 is switched on when the current $I_{R1}$ across the resistance R1 satisfies the following condition:

$$I_{R1} > \frac{V_{be,Q1}}{R_1}$$

As the current at the base terminal of the switch transistor Q1 is very small, the current $I_{R1}$ will be approximately equal to the driver current $I_B$ on the LED channel B. By selecting the value of the resistance R1 depending on the range of driver current $I_B$ intended for driving the LED element 220 and the characteristic threshold voltage $V_{be,Q1}$ of the switch transistor Q1, a desired current threshold condition for opening/closing the controlled switch 290 may be easily implemented. For instance, for a threshold voltage $V_{be,Q1}=0.6$ V for transistor Q1 and a resistance R1=330 Ohm, the switch Q1 automatically switches on when the current $I_{R1}$ across the resistance R1 becomes higher than 1.8 mA.

An implementation of a variable current source 280 will now be explained with reference to FIG. 6. As shown in FIG. 6, the variable current source 280 is a voltage-controlled current source that includes a transistor Q2, such as a bipolar n-p-n transistor 294, and a resistance R2 connected between the emitter terminal of Q2 and a reference potential, such as ground. Considering that the base current $I_b$ of transistor Q2 is generally very small when compared with its collector current $I_c$, the emitter current $I_e$ and collector $I_c$ have approximately the same values. The emitter current $I_e$ corresponds to the current across the resistance R2 and depends on the voltage $V_{Reg}$ applied at the base of the transistor Q2 (for e.g. the voltage $V_{DAC}$ mentioned above) and the characteristic threshold voltage $V_{be,Q2}$ of transistor Q2 as follows:

$$I_{c,Q2} \cong I_{e,Q2} = \frac{(V_{Reg} - V_{be,Q2})}{R_2}$$

The range of the compensation current pulse $I_C$ may then be set by selecting suitable values for the resistance R2 and threshold voltage $V_{be,Q2}$. For instance, using a resistance R2=900 Ohm, a n-p-n bipolar transistor Q2 with $V_{be,Q2}$ of about 0.6 V, the collector current $I_{c,Q2}$ of Q2 may be easily varied between 0 and 3 mA based on a regulation voltage signal $V_{Reg}$ output from the microcontroller 260 varying in a range between 0.6 to 3.3 V. The collector current $I_{c,Q2}$ is applied to the collector of switch transistor Q1 of the controlled switch 290, and therefore, corresponds approximately to the current $I_{OUT}$ output by the voltage-controlled current source 280. Thus, the amplitude of the compensation pulse $I_C$ can be easily controlled by adjusting the voltage signal $V_{DAC}$ of the microcontroller 260. Moreover, the synchronization of the controlled switch 290 with the driver current pulse on channel B explained above allows to achieve a real time adjustment of imbalances between the two LED signals.

The amount of compensation necessary for correcting imbalances caused by differences in the LEDs intrinsic characteristics and/or due to exposure to sunlight may be determined based on the photodetector signals 245 received by the rain sensor IC 250. The photodetector currents $I_{PD\_LED\_A\_ON}$ and $I_{PD\_LED\_B\_ON}$ output to the microcontroller 260 may be used for determining whether a compensation operation should be applied on one of the driver channels (e.g. channel B). Exemplary compensation operations performed by the microcontroller 260 based on the photodetector currents $I_{PD\_LED\_A\_ON}$ and $I_{PD\_LED\_B\_ON}$ output by the rain sensor IC 250 will now be described with reference to FIGS. 7-9.

Figure 7:
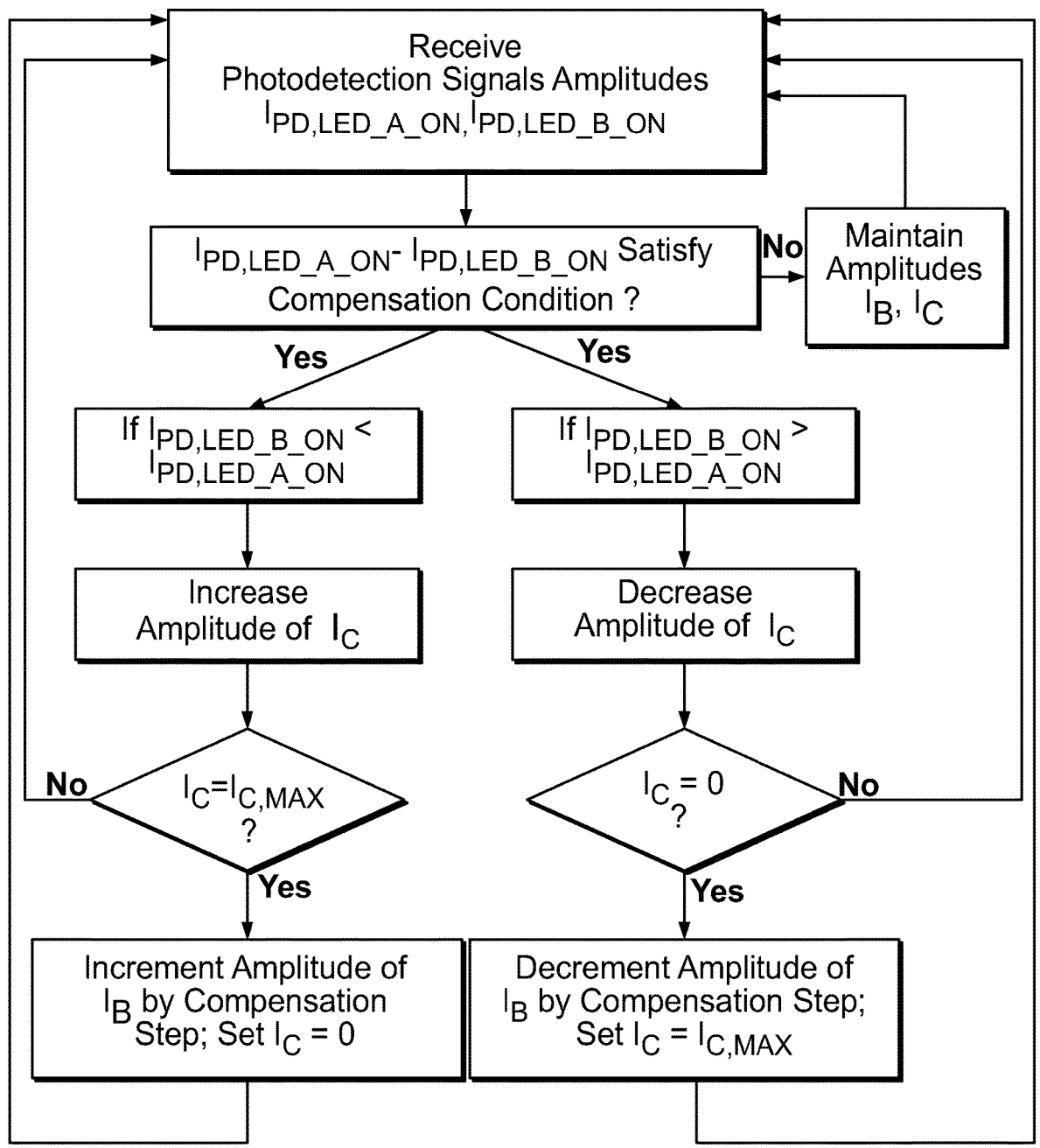
FIG. 7 is a flowchart of a compensation operation for compensating imbalance between the light pulses emitted by the light emitting elements of the optical rain sensor device.

FIG. 7 depicts a flowchart of a compensation operation performed by the microcontroller 260. Upon receiving the measured values $I_{PD\_LED\_A\_ON}$ and $I_{PD\_LED\_B\_ON}$ of the photodetection signals 245, the microcontroller 260 decides whether a compensation operation to correct imbalance between LEDs A and B is necessary based on a relation between the amplitudes $I_{PD\_LED\_A\_ON}$ and $I_{PD\_LED\_B\_ON}$ and a predetermined compensation condition that should be satisfied for applying current compensation on one of the driver channels (for e.g. channel B). For instance, the predetermined compensation condition may include a difference between the amplitudes $I_{PD\_LED\_A\_ON}$ and $I_{PD\_LED\_B\_ON}$ being higher than a given amount.

If the compensation condition is satisfied, the microcontroller 260 decides on the type of compensation to be applied depending on the relation between the measured values $I_{PD\_LED\_A\_ON}$ and $I_{PD\_LED\_B\_ON}$, i.e. based on whether the photodetection current measured when the LED A is on (and LED B is off) is stronger or weaker than the photodetection current measured when the LED B is on (and LED A is off). If compensation is required, the microcontroller 260 will perform a compensation operation for increasing (or decreasing) the total current across LED B, as it will be described below. The microcontroller 260 may then continue to receive and monitor the values $I_{PD\_LED\_A\_ON}$ and $I_{PD\_LED\_B\_ON}$ continuously (or at predetermined time intervals), such as to compare the received values and decide in real-time whether further compensation is still required.

The compensation operation for increasing the total current $I_{LED\_B}$ across LED B in case the amplitude of the photodetector signal 245 is stronger when LED A is on ($I_{PD\_LED\_A\_ON} > I_{PD\_LED\_B\_ON}$) will now be described with reference to FIG. 8.

Figure 8:
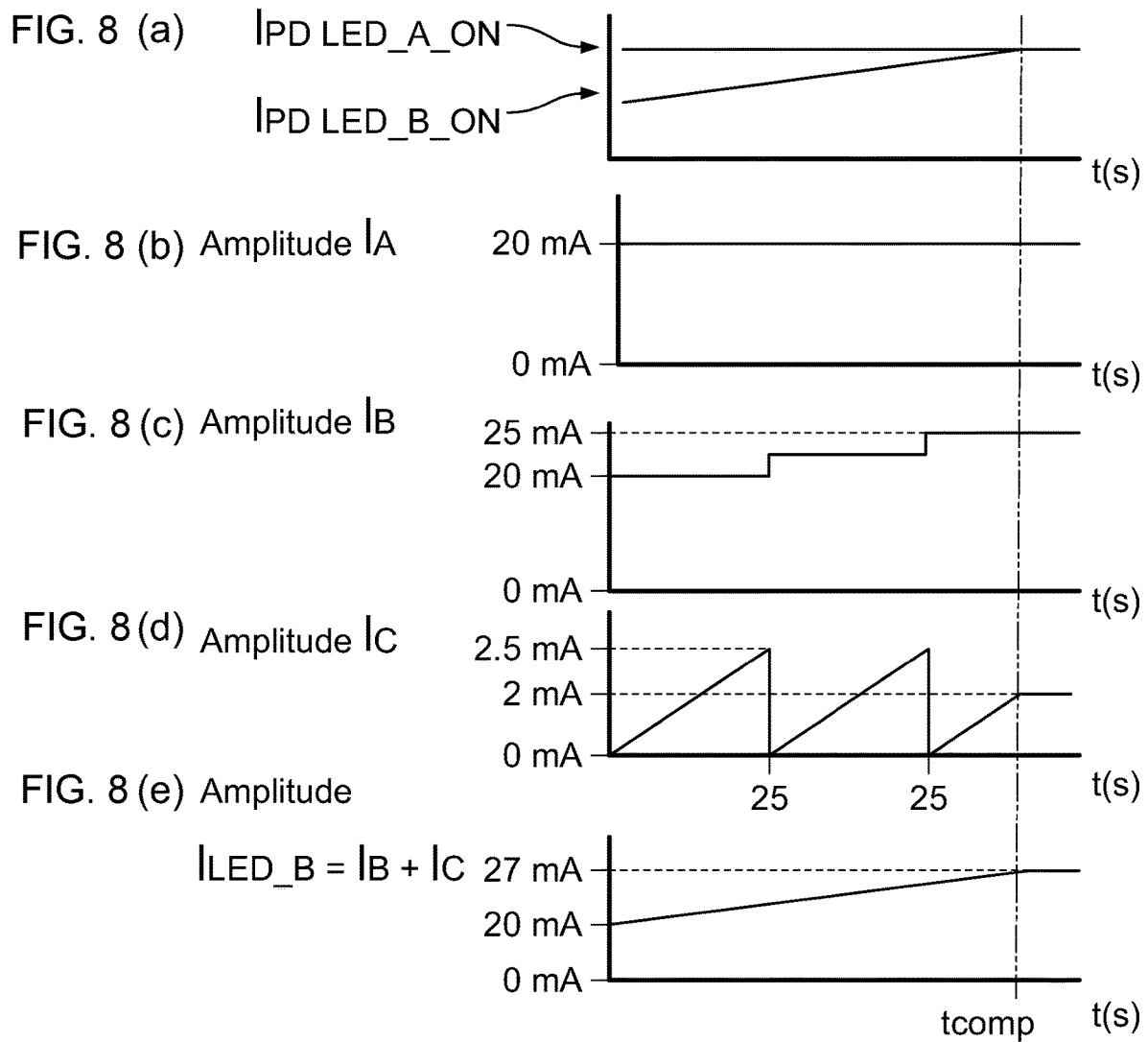
FIG. 8A is a graph of amplitudes of photodetector signals during a compensation operation that is carried out when the light pulse emitted by the light emitting element on channel A is more intense than the light pulse emitted by the light emitting element on channel B for the same amplitude of driver currents.
FIG. 8B is a graph of an amplitude of the driver pulse output to channel A during the compensation operation.
FIG. 8C is a graph of an amplitude of the driver pulse output to channel B during the compensation operation.
FIG. 8D is a graph of the amplitude of the compensation current signal output by the regulated current source during fine current adjustment.
FIG. 8E is a graph of the amplitude of the total current across the light emitting element on channel B during the compensation operation.

FIG. 8 illustrates the result of a compensation operation carried out by the microcontroller 260 in a situation where both LEDs on channels A and B are initially driven by driver currents pulses $I_B$ and $I_A$ of a same amplitude (for e.g. 20 mA) but the light signal emitted by the light emitting element 220 on channel B (LED B) is less intense than the light signal emitted by the light emitting element 225 on channel A (LED A). Due to this imbalance, the photodetector 240 detects less reflected light when LED B is on, and consequently, the amplitude $I_{PD\_LED\_B\_ON}$ of the photodetector signal $I_{PD}$ is initially lower than the amplitude $I_{PD\_LED\_A\_ON}$ measured when LED A is on (and LED B is off) as shown in FIG. 8(a).

In this situation, if the difference between amplitudes $I_{PD\_LED\_A\_ON}$ and $I_{PD\_LED\_B\_ON}$ satisfies the predetermined compensation condition, the microcontroller 260 determines that compensation is required and outputs a regulation signal $V_{Reg}$ for controlling the regulated current source 270 to output a compensation current IC. In order to achieve a smooth compensation, the regulation voltage $V_{Reg}$ may be gradually increased within a given range, for e.g. from 0 to a maximum value $V_{Reg,MAX}$, such as to cause the regulated current source 270 to perform fine current adjustment by gradually increasing the amplitude of the compensation current pulse $I_C$ from 0 up to a maximum value $I_{C,MAX}$. In the example of FIG. 6, the maximum current $I_{C,MAX}$ that can be achieved during the fine current adjustment is a factor of the maximum regulated voltage $V_{Reg,MAX}$ ($I_{C,MAX} = V_{Reg,MAX}/R2$). The rate at which the compensation current $I_C$ is increased is limited to a fixed rate, for e.g. to less than or equal to 0.1 mA/s, by limiting the speed of variation of $V_{Reg}$ such as to avoid that any sudden variation in the photodetector signal 245 caused by real water drops is cancelled out by the gradual variation of the compensation current $I_C$ itself. Sudden variations of the photodetector signal 245 due to water drops may be distinguished from others types of variations by filtering the photodetector signal 245 in the microcontroller 260 with a digital high-pass filter.

During the fine current adjustment under control of the regulation signal $V_{Reg}$, the microcontroller 260 may continuously monitor and compare the measured values $I_{PD\_LED\_A\_ON}$ and $I_{PD\_LED\_B\_ON}$ of the photodetector signal 245, and maintain the gradual increase of the compensation current $I_C$ amplitude by gradually increasing the regulation voltage $V_{Reg}$ while the difference ($I_{PD\_LED\_A\_ON} - I_{PD\_LED\_B\_ON}$) continues to satisfy the compensation condition or until the maximum compensation current $I_{C,MAX}$ (i.e. the maximum regulation voltage $V_{Reg,MAX}$) is reached. In case the measured values $I_{PD\_LED\_B\_ON}$ and $I_{PD\_LED\_A\_ON}$ are not balanced at maximum compensation current $I_{C,MAX}$, i.e. the difference ($I_{PD\_LED\_A\_ON} - I_{PD\_LED\_B\_ON}$) still satisfies the compensation condition, the microcontroller 260 may decide to apply a coarse adjustment of the driver current $I_B$ by instructing the rain sensor IC 250 to increase the driver current output by the driver 254 on channel B by a compensation step of a predetermined value. For instance, the compensation step may be selected as the minimum current resolution provided by the rain sensor IC 250 and/or to correspond to the maximum compensation current $I_{C,MAX}$ itself (2.5 mA in the example of FIG. 8) for ensuring a smooth transition. The regulation voltage $V_{Reg}$, and consequently, the compensation current $I_C$, is then reset to zero. Meanwhile, the photodetector signal 245 continues to be monitored and the measured values $I_{PD\_LED\_A\_ON}$, $I_{PD\_LED\_B\_ON}$ compared by the microcontroller 260 to judge whether a further fine current adjustment is required. In case the compensation condition is still satisfied, the microcontroller 260 may perform a further fine current adjustment by gradually increasing the regulation voltage $V_{Reg}$ from 0 until reaching an amplitude for the compensation current $I_C$ at which the measured values $I_{PD\_LED\_B\_ON}$, $I_{PD\_LED\_A\_ON}$ no longer satisfy the compensation condition or until the maximum compensation current $I_{C,MAX}$ is reached.

Depending on the initial mismatch between the photodetector current values $I_{PD\_LED\_A\_ON}$ and $I_{PD\_LED\_B\_ON}$, it might be necessary to apply several sequences of fine current adjustment followed by coarse adjustment until reaching a stage where the desired balance between LED signals 236, 238 is reached and the compensation condition is no longer satisfied by the measured photodetector currents $I_{PD\_LED\_A\_ON}$ and $I_{PD\_LED\_B\_ON}$. In the case illustrated in FIG. 8, two sequences of fine current adjustment followed by a coarse adjustment are applied before reaching the stage ($t = t_{comp}$ in FIG. 8) where the difference between the measured values $I_{PD\_LED\_A\_ON}$ and $I_{PD\_LED\_B\_ON}$ becomes negligible and the compensation condition is no longer satisfied. After this stage, the light pulses from LED A and LED B are considered to be compensated and the microcontroller 260 performs control of the rain sensor IC 250 and the regulated current source 270 for maintaining the amplitudes of the driver current pulse $I_B$ and the compensation pulse $I_C$ reached at time $t_{comp}$, as shown in FIG. 8(c) and FIG. 8(d) at $t > t_{comp}$.

Figure 9:
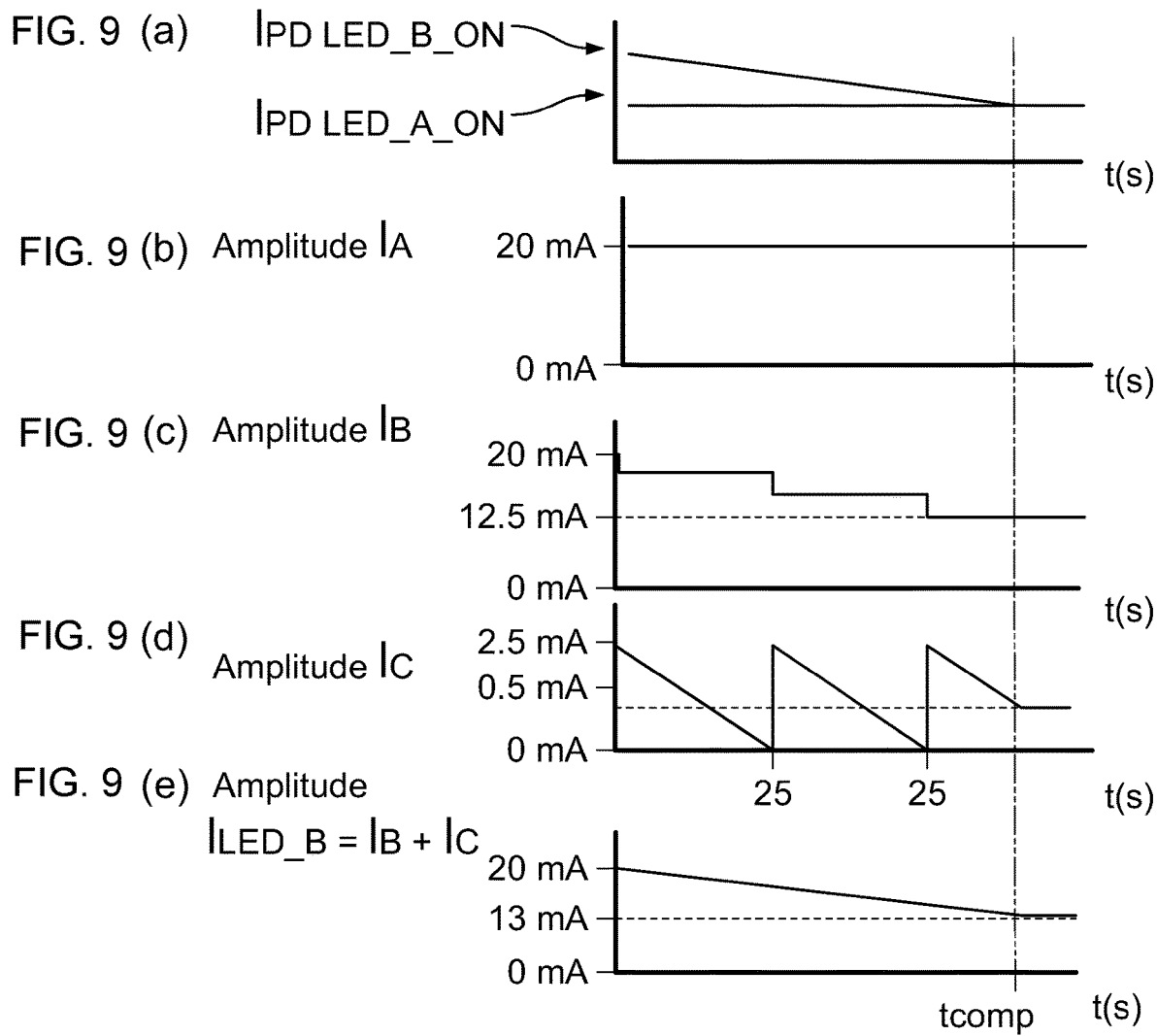
FIG. 9A is a graph of amplitudes of the photodetector signals during a compensation operation that is carried out when the light pulse emitted by the light emitting element on channel A is less intense than the light pulse emitted by the light emitting element on channel B for the same amplitude of driver currents.
FIG. 9B is a graph of an amplitude of the driver pulse output to channel A during the compensation operation.
FIG. 9C is a graph of an amplitude of the driver pulse output to channel B during the compensation operation.
FIG. 9D is a graph of the amplitude of the compensation current signal output by the regulated current source during fine current adjustment.
FIG. 9E is a graph of the amplitude of the total current across the light emitting element on channel B during the compensation operation.

FIG. 9 illustrates a compensation operation carried out by the microcontroller 260 when the light signal emitted by LED B is more intense than the light signal emitted by LED A ($I_{PD\_LED\_A\_ON} < I_{PD\_LED\_B\_ON}$) while both LEDs are being driven by currents $I_B$ and $I_A$ of a same value, for e.g. 20 mA. In this case, the photodetector 240 detects more reflected light when LED B is on (and LED A is off), and consequently, the measured value $I_{PD\_LED\_B\_ON}$ of the photodetector signal 245 is higher than the value $I_{PD\_LED\_A\_ON}$ measured when LED A is on (and LED B off). In case the difference $|I_{PD\_LED\_A\_ON} - I_{PD\_LED\_B\_ON}|$ satisfies the compensation condition, the microcontroller 260 applies a compensation operation for decreasing the total current across LED B.

When the microcontroller 260 determines that the total current across LED B should be decreased for correcting imbalance between LEDs A and B, the microcontroller 260 controls the regulated current source 270 to decrease the amplitude of the compensation current $I_C$ that might be currently output to channel B by gradually decreasing the corresponding regulation voltage $V_{Reg}$. During this fine current adjustment under control of the adjustable regulation voltage $V_{Reg}$, the microcontroller 260 may monitor and compare the amplitudes $I_{PD\_LED\_A\_ON}$ and $I_{PD\_LED\_B\_ON}$ of the photodetector signal 245, and continue to gradually decrease the amplitude of the compensation current $I_C$ as long as the difference $|I_{PD\_LED\_A\_ON} - I_{PD\_LED\_B\_ON}|$ satisfies the compensation condition or until a minimum compensation current $I_{C,MIN}$ that can be output by the current regulated source 270 (for e.g. $I_{C,MIN}=0$) is attained.

If the measured values $I_{PD\_LED\_B\_ON}$ and $I_{PD\_LED\_A\_ON}$ are still not balanced when the minimum compensation current $I_{C,MIN}$ is reached, i.e. the difference $|I_{PD\_LED\_A\_ON} - I_{PD\_LED\_B\_ON}|$ still satisfies the condition for applying compensation, the microcontroller 260 may decide to apply a coarse adjustment of the driver current $I_B$ by instructing the rain sensor IC 250 to decrease the driver current In output by the driver 254 on channel B by an amount corresponding to a predetermined compensation step. This compensation step may be of same magnitude as the compensation step used for coarse adjustment described with reference to FIG. 8.

In order to ensure that the compensation of the total current across the LED on channel B proceeds in a smooth manner, once the driver current $I_B$ is decremented by the compensation step, the microcontroller 260 may simultaneously output a regulation voltage $V_{Reg}$ of an amplitude $V_{Reg,MAX}$ which is sufficient for controlling the regulated current source 270 to apply a compensation current $I_C$ on channel B with a value $I_{C,MAX}$ that is comparable to the decrement of the driver current In achieved by the compensation step. In case the compensation current $I_C$ was already at the minimum value $I_{C,MIN}$ when the microcontroller 260 first detects an imbalance between the measured values $I_{PD\_LED\_B\_ON}$ and $I_{PD\_LED\_A\_ON}$, the microcontroller 260 may directly apply a coarse adjustment by decrementing the driver current $I_B$ and setting the compensation current to the maximum value $I_{C,MAX}$, as illustrated in FIG. 9(*c*) and FIG. 9(*d*). The microcontroller 260 then applies a fine current adjustment by gradually decreasing the regulation voltage $V_{Reg}$ from the maximum amplitude $V_{Reg,MAX}$ so as to smoothly reduce the amplitude of the compensation current $I_C$ output by the regulated current source 270 from $I_{C,MAX}$, while comparing (continuously or at predetermined time intervals) the amplitudes $I_{PD\_LED\_A\_ON}$ and $I_{PD\_LED\_B\_ON}$ of the photodetector signals 245. The gradual decrease of the amplitude of the compensation current $I_C$ proceeds until the difference between $I_{PD\_LED\_A\_ON}$ and $I_{PD\_LED\_B\_ON}$ no longer satisfies the compensation condition or until the compensation current $I_C$ reaches zero.

In case the measured values $I_{PD\_LED\_A\_ON}$ and $I_{PD\_LED\_B\_ON}$ are not balanced when the $I_C$ reaches the minimum value $I_{C,MIN}$ (for e.g. zero), the microcontroller 260 again instructs the rain sensor IC 250 to decrement the driver current output by driver 254 on channel B by a further compensation step, and sets the regulation voltage $V_{Reg}$ again to the maximum value $V_{Reg,MAX}$. A further sequence of fine current adjustment, followed by a coarse current adjustment, may be applied until the desired balance between the photodetector amplitudes $I_{PD\_LED\_A\_ON}$ and $I_{PD\_LED\_B\_ON}$ is reached and the compensation condition is no longer satisfied. In case the amplitudes $I_{PD\_LED\_A\_ON}$ and $I_{PD\_LED\_B\_ON}$ become balanced during the next sequence of fine current adjustment and no longer satisfy the compensation condition (as shown in FIG. 9(*e*) at time $t_{comp}$), the microcontroller 260 interrupts the fine current adjustment operation and maintains the compensation current $I_C$ (i.e. the regulation voltage $V_{Reg}$) and the amplitude of the driver current $I_B$ at the values for which balance was reached, as shown in FIGS. 9(*c*) and 9(*d*) at $t>t_{comp}$. Similarly to the compensation operation by increment described with reference to FIG. 8, the decreasing rate of the compensation current $I_C$ is limited, for e.g. to less than 0.1 mA/s.

The combination of the fine current adjustment via the regulated current source 270 with the coarse current adjustment provided by the rain sensor IC 250 itself allows to reach balance between the photodetector signals $I_{PD\_LED\_A\_ON}$ and $I_{PD\_LED\_B\_ON}$ in a smooth manner while ensuring that any sudden variations in the photodetector signals caused by real water drops will not be masked by the compensation operation or go undetected.

The present invention solves a major limitation of existing optical rain sensors by providing an external regulated current source that allows achieving a fine adjustment of the imbalance between LED signals and in real-time. Furthermore, the technique described above is able to synchronize itself to the driving signals of the LED driver of the rain sensor IC, which solves a shortcome of existing rain sensor ICs, which have no signals available to guarantee synchronization of an external current source. Moreover, the solution of the present invention uses few components, is low cost and robust. It also provides a small footprint on PCB, which is an additional advantage since PCB area is limited for optical rain sensor devices.

Finally, although the present invention has been described above with reference to optical rain sensors used in windshields, the principles of the present invention can also be advantageously applied to other applications, including industrial camera and window systems, sensors for ambient light measurements used in the control of headlights/lights, head-up displays, and air conditioning.

What is claimed is:

1. An optical rain sensor device, comprising:
   a first light emitting element adapted to emit a first light pulse toward an inner surface of a transparent substrate;
   a second light emitting element adapted to emit a second light pulse toward the inner surface of the transparent substrate;
   a photodetector adapted to detect a light from the first light pulse and the second light pulse that is reflected by the inner surface of the transparent substrate; and
   a rain sensor controller including a first driver adapted to output a first driver current pulse on a first channel for driving the first light emitting element to emit the first light pulse, a second driver adapted to output a second driver current pulse on a second channel for driving the second light emitting element to emit the second light pulse, and a regulated current source connected between the second channel and a terminal of the second light emitting element, the regulated current source is adapted to apply a compensation current signal at the terminal of the second light emitting element based on a regulation signal so that a total current across the second light emitting element is increased or decreased to reduce an imbalance between the first light pulse and the second light pulse.

2. The optical rain sensor device of claim 1, wherein the regulated current source is adapted to apply the compensation current signal in synchronization with the second driver current pulse.

3. The optical rain sensor device of claim 1, further comprising a microcontroller adapted to output the regulation signal for controlling the regulated current source to output the compensation current signal with a given amplitude, the compensation current signal is a square current pulse with an amplitude which is set based on the regulation signal, the regulation signal is an analog regulation voltage provided by an digital-analog converter output of the microcontroller.

4. The optical rain sensor device of claim 1, wherein the regulated current source includes a variable current source adapted to supply an output current with a constant intensity that is adjustable based on the regulation signal, and a controlled switch connected between the terminal of the second light emitting device and the output terminal of the variable current source, the controlled switch switches between an on state and an off state in synchronization with the second driver current pulse for connecting and disconnecting the variable current source, generating the compensation current signal based on the output current with the constant intensity.

5. The optical rain sensor device of claim 4, wherein the controlled switch switches to the on state when the second driver current pulse is above a predetermined current threshold condition.

6. The optical rain sensor device of claim 5, wherein the controlled switch includes a switch transistor and a first resistance element connected between a base terminal and an emitter terminal of the switch transistor, the emitter terminal of the switch transistor applying the compensation current signal to the terminal of the second light emitting device.

7. The optical rain sensor device of claim 6, wherein the first resistance element is connected between the second channel and the terminal of the second light emitting element to sense the second driver current pulse and develop a voltage difference across the first resistance element that causes the switch transistor to open when the second driver current pulse is larger than the predetermined current threshold.

8. The optical rain sensor device of claim 4, wherein the variable current source has a driving transistor adapted to supply the output current based on the regulation signal applied at a base terminal of the driving transistor.

9. The optical rain sensor device of claim 8, wherein the variable current source has a second resistance element connected between an emitter terminal of the driving transistor and a reference potential, the second resistance element provides a desired fine adjustment of an amplitude of the compensation current signal based on the regulation signal.

10. A regulated current source for fine adjustment of a driver current pulse supplied to a light emitting device of an optical rain sensor, comprising:
a variable current source supplying an output current with a constant intensity that is adjustable based on an external regulation signal; and
a controlled switch connected between a terminal of the light emitting device and an output terminal of the variable current source, the controlled switch switches between an on state and an off state in synchronization with the driver current pulse supplied to the light emitting device for connecting and disconnecting the variable current source, generating a compensation current signal based on the regulation signal, the compensation current signal is superimposed on the driver current pulse across the light emitting device to reduce an imbalance between the driver current pulse and another drive current pulse supplied to another light emitting device.

11. The regulated current source of claim 10, wherein the controlled switch switches to the on state when the driver current pulse is above a predetermined current threshold condition.

12. The regulated current source of claim 11, wherein the controlled switch includes a switch transistor and a first resistance element connected between a base terminal and an emitter terminal of the switch transistor, the emitter terminal of the switch transistor applying the compensation current signal to the terminal of the light emitting device.

13. The regulated current source of claim 12, wherein the first resistance element is connected between a driver channel supplying the driver current pulse and the terminal of the light emitting element to sense the driver current pulse and develop a voltage difference that causes the switch transistor to open when the driver current pulse is larger than the predetermined current threshold.

14. The regulated current source of claim 12, wherein the variable current source has a driving transistor adapted to supply the output current based on the regulation signal, the regulation signal is a regulation voltage applied at a base terminal of the driving transistor.

15. The regulated current source of claim 14, wherein the variable current source has a second resistance element connected between an emitter terminal of the driving transistor and a reference potential, the second resistance element provides a desired fine adjustment of an amplitude of the compensation current signal based on the regulation signal.

16. A method for fine adjustment of a driving current of a light emitting element of an optical rain sensor, comprising:
providing the optical sensor including a first light emitting element adapted to emit a first light pulse toward an inner surface of a transparent substrate, a second light emitting element adapted to emit a second light pulse toward the inner surface of the transparent substrate, a photodetector adapted to detect a light from the first light pulse and the second light pulse that is reflected by the inner surface of the transparent substrate, and a rain sensor controller including a first driver adapted to output a first driver current pulse on a first channel for driving the first light emitting element to emit the first light pulse, and a second driver adapted to output a second driver current pulse on a second channel for driving the second light emitting element to emit the second light pulse;
receiving an amplitude of a first photodetection signal corresponding to the reflected first light pulse and an amplitude of a second photodetection signal corresponding to the reflected second light pulse;
deciding whether a difference between the amplitudes of the first photodetection signal and the second photodetection signal satisfies a compensation condition associated with an imbalance between the first light pulse and the second light pulse; and
applying, with an external regulated current source, a compensation current signal on the second channel while the compensation condition is satisfied, the compensation current signal is adapted to increase or decrease a total current across the second light emitting element based on a relation between the amplitudes to reduce an imbalance between the first photodetection signal and the second photodetection signal.

17. The method of claim 16, wherein when the amplitude of the second photodetection signal is lower than the amplitude of the first photodetection signal, the method further comprises:
- monitoring the amplitudes of the first photodetection signal and the second photodetection signal;
- gradually increasing an amplitude of the compensation current signal within a current range while the amplitudes of the first photodetection signal and the second photodetection signal satisfy the compensation condition and the amplitude of the compensation current signal is below a maximum value of the current range; and
- if the compensation condition is satisfied when the amplitude of the compensation current signal reaches the maximum value of the current range, increasing the second driver current pulse by a compensation step and setting the amplitude of the compensation current signal to a minimum value of the current range.

18. The method of claim 17, wherein when the amplitude of the second photodetection signal is higher than the amplitude of the first photodetection signal, the method further comprises:
- decreasing the second driver current pulse by a compensation step and applying the compensation current signal on the second channel with an amplitude equal to the maximum value of the current range;
- monitoring the amplitudes of the first photodetection signal and the second photodetection signal;
- gradually decreasing the amplitude of the compensation current signal within the current range while the amplitudes of the first photodetection signal and the second photodetection signal satisfy the compensation condition and the amplitude of the compensation current signal is above the minimum value of the current range; and
- if the compensation condition is still satisfied when the amplitude of the compensation current signal reaches the minimum value of the current range, decreasing the second driver current by a compensation step and setting the amplitude of the compensation current signal to the maximum value of the current range.

* * * * *